United States Patent [19]

Simpson

[11] Patent Number: 4,764,848
[45] Date of Patent: Aug. 16, 1988

[54] SURFACE MOUNTED ARRAY STRAIN RELIEF DEVICE

[75] Inventor: John P. Simpson, Apalachin, N.Y.

[73] Assignee: International Business Machines Corporation, Armonk, N.Y.

[21] Appl. No.: 934,297

[22] Filed: Nov. 24, 1986

[51] Int. Cl.[4] ............................................. H05K 1/18
[52] U.S. Cl. ................................ 361/408; 174/52 FP; 361/421; 439/81
[58] Field of Search .................. 174/52 FP; 361/408, 361/44, 421; 339/17 CF; 261/408; 439/61, 80, 81

[56] References Cited

U.S. PATENT DOCUMENTS

| | | | |
|---|---|---|---|
| 3,368,114 | 2/1968 | Campbell et al. | 174/52 FP |
| 3,517,438 | 6/1970 | Johnson et al. | 174/52 FP |
| 3,795,037 | 3/1974 | Luttmer | 174/52 FP |
| 3,904,262 | 9/1975 | Cutchaw | 174/16 HS X |
| 3,921,285 | 11/1975 | Krall | 174/68.5 X |
| 3,940,786 | 2/1976 | Scheingold et al. | 174/52 FP X |
| 3,984,166 | 10/1976 | Hutchinson | 339/17 CF |
| 4,155,615 | 5/1979 | Zimmerman et al. | 174/52 FP X |
| 4,272,140 | 6/1981 | Lychuk et al. | 339/17 CF |
| 4,396,935 | 8/1983 | Schuck | 174/52 R X |
| 4,553,192 | 11/1985 | Babuka et al. | 361/395 |
| 4,634,199 | 1/1987 | Anhalt et al. | 439/69 |
| 4,667,219 | 5/1987 | Lee et al. | 357/80 X |

OTHER PUBLICATIONS

T. J. Rajac, Integrated Circuit Structure Including Soldered Lead Frame, IBM Tech. Disc. Bull., V. 16 #6, Nov. 1973, p. 1738 relied on.
Larnerd et al., IC Package Assemblies, IBM Tech. Disc. Bull., V. 21 #5, Oct. 1978, pp. 1817 & 1818 relied on.
W. R. Deboskey, Directly Attached Integrated Circuit Lead Frame, IBM Tech. Disc. Bull., V. 15 #1, Jun. 1972, p. 307 relied on.
Andres et al., Cooling System for Semiconductor Modules, IBM Tech. Disc. Bull., V. 26 #3B, p. 1548 relied on.
Hinrichsmeyer et al., Solder-Filled Elastomeric Spacer, IBM Tech. Disc. Bull., v. 27 #8, Jan. 1985, p. 4855 relied on.
L. Baffaro, Pin Structure for Heatless Replacement of Pin-Type Modules, IBM Tech. Disc. Bull., V. 21, #9, Feb. 1979, p. 3724 relied on.

*Primary Examiner*—R. R. Kucia
*Attorney, Agent, or Firm*—Lawrence R. Fraley; Mark Levy

[57] ABSTRACT

An electrical assembly having an integrated circuit package which has a plurality of electrical conductors fixed thereto. The electrical conductors form mechanical and electrical connections. Each of the electrical conductors has a root at one end and a tip at the other end. The root of each conductor is attached to the integrated circuit package to form a fixed electrical and mechanical connection. The tip of each conductor is adapted to be connected to a surface at a predetermined location. Each of the electrical conductors has at least two bends between the root and the tip for providing strain relief when the tip is connected to a surface.

24 Claims, 3 Drawing Sheets

SURFACE MOUNTED ARRAY STRAIN RELIEF DEVICE

BACKGROUND OF THE INVENTION

1. Field Of The Invention

This invention relates to a strain relief device and, more particularly, to a strain relief device for use in mounting an electronic component to the surface of a printed circuit board.

In the field of electronic circuitry and packaging, there has been a need to develop ever more densely packed circuitry for use in electronic components and devices, such as those used in the computer industry for example. Semiconductor devices in particular have been the subject of much innovation in the field of integration. Accepting the need to place an increasing number of circuits in a given space, one of the best solutions in providing such sophisticated electronic circuitry in a relatively small package has been to associate one or more complex integrated circuit chips in conjunction with, or in proximity to, a printed circuit board.

It has been found that bonding chips directly to boards by means of solder, for example, is often unsatisfactory. In certain operating situations, it is the bond that fails before its associated chip or board. Accordingly, one solution is to mount integrated circuit chips to a substrate which, in turn, is mounted to the surface of a printed circuit board.

A vehicle for accomplishing this goal has incorporated metallized ceramic substrates, as taught in U.S. Pat. No. 3,921,285, issued to Krall and assigned to the present assignee, which comprise a rigid planar ceramic chip carrier to which is attached a rigid silicon integrated circuit chip.

In order to utilize both sides of a printed circuit board and to economize the size of printed circuit board surfaces and in order to decrease electrical and mechanical problems associated with pin in holes—so called thru holes—in certain circumstances, mounting components to the surfaces of boards has been found to be advantageous.

Dual in-line packages (DIPs) are conventionally mounted to the surface of printed circuit boards. Generally these devices are rectangular and have one row of electrically conductive leads attached to each of the two longest edges. The amount of circuitry and the complexity thereof are, of course, limited to that for which two parallel rows of leads are adequate.

Devices that are mounted with connections around the periphery of course permit more connections than do DIPs. Similarly, more sophisticated electronic components, such as highly integrated circuit chips having connections in a two dimensional array pattern, have the advantage of permitting more circuitry connections to be made in the same space than even peripherally leaded structures.

The leads or pins must perform two functions: provide a mechanical, physical link between the chip, through the ceramic substrate, to the board; and provide an electrical connection so that circuitry on the chip can communicate with electrically conductive paths on the surface of or within the board.

A problem arises when array substrates are mounted directly to printed circuit boards. The substrates themselves tend to be relatively rigid and inflexible, but the thermal coefficients of expansion differ between the material of which a printed circuit board is comprised and a second material of which a substrate to be mounted is comprised, causing a strain therebetween. As an example when subjected to changes of temperature, an epoxy printed circuit board tends to expand at as much as five times the rate of ceramic that is used to form a substrate. Moreover, flexure of the printed circuit board and other stresses such as mechanical vibration, shock and torque can also occur, giving rise to strain.

Due to the nature of the aforementioned stresses that are likely to occur over the lifetime of an electronic product, movement of a substrate relative to the board on which it is mounted may occur in the X and Y directions (i.e., along the plane of the printed circuit board) and/or in the Z direction (i.e., perpendicular to that plane). Such movement could not be tolerated in a surface mounting technique without an appropriate strain relief mechanism.

Shape of a strain relief mechanism is crucial in obtaining relative movement of two ends of the structure without exceeding the modulus of elasticity. For example, the helical structure of an automobile road spring accomplishes such a shock absorbing function in a relatively small amount of space. In the present electronic packaging case, a pin of sufficient length to provide strain relief can be folded, in accordance with the present invention hereinafter further described, in order to reduce vulnerability of short circuiting and to provide movement along the Z-axis (i.e., to provide vertical compliance within a reasonable length). But helical winding is difficult to implement and has electrical disadvantages.

The dimensional limitation alluded to above—height above the surface of a printed circuit board—often occurs due to other packaging requirements that facilitate loading a so-called populated board into a rack or cage. The space between one populated board and another or between a populated board and a cage wall may dictate limits to the board thickness. Thus, what is needed is a surface mounting technique or device that allows for strain caused by flexure, torque, thermal expansion and the like but does not require a great amount of space.

An article titled "Directly Attached Integrated Circuit Lead Frame" by W. R. DeBoskey, IBM Technical Disclosure Bulletin, Vol. 15, No. 1, page 307 (June, 1972) discloses a lead frame directly attached to integrated circuit chips by solder-reflow joints. Such a mechanism minimizes or eliminates the effect of thermal mismatch between a chip and a lead frame. In the disclosed apparatus, however, the chip is secured to the frame housing so that, while thermal effects are neutralized and an electrical connection is established, no mechanical connection is made.

An article titled "Cooling System For Semiconductor Modules" by H. Andres et al, IBM Technical Disclosure Bulletin, Vol. 26, No. 3B, page 1548 (August, 1983) discloses a ceramic substrate to which semiconductor chips are soldered by solder balls. Resilient pins or wires are used to connect the solder balls of chips to pads on a surface of a substrate. Once again, the chips themselves are connected to a frame structure. No mechanical connection is made by means of the resilient pins.

An article titled "Solder-Filled Elastomeric Spacer" by K. Hinrichsmeyer et al, IBM Technical Disclosure Bulletin, Vol. 27, No. 8, page 4855 (January, 1985) discloses a solder-filled elastomeric spacer which permits soldering semiconductor chips to substrates having a thermal coefficient of expansion different than that of the semiconductor material. Solder strings accommodate mechanical tensions resulting from the different thermal coefficients of thermal expansion. It is the ductility of solder—a plastic deformation phenomenon—that provides tension relief to this structure.

An article titled "Pin Structure For Heatless Replacement of Pin-Type Modules" by L. Baffaro, IBM Technical Disclosure Bulletin, Vol. 21, No. 9, page 3724 (February, 1979) discloses a pin structure for use with modules and printed circuit boards that permits heatless replacement of modules for repair or engineering changes. The purpose of this structure is to provide a simplified method of replacing a chip. The shape of the connector pins actually provides a redundant conductor for purposes of re-work. The pin is shaped so as to return upon itself above the upper surface of the chip so that it may be cut and replaced when desired without heating or removing pins from a printed circuit board.

U.S. Pat. No. 4,396,935 issued to Schuck discloses an integrated circuit package for flat circuit elements such as chips and an electrical connector for receiving such a package. The electrical connector is a cylindrically shaped hollow socket. The inner cylindrical wall contains resilient pin-like connections arranged in a circle for making contact with the corresponding conductor of the integrated circuit package. Such a configuration of pins is normally used to form wiping contacts, wherein one electrical contact or group of contacts brushes or wipes against a second contact or group of contacts. Fixed connections are not normally associated with such a connector apparatus.

It would be advantageous to provide an electrical assembly for use in mounting an integrated circuit chip by means of a substrate to a printed circuit board.

It would further be advantageous to provide an electrical assembly for mounting a two dimensional, matrix or array substrate to the surface of a printed circuit board.

It would also be advantageous to provide an electrical and also a mechanical link between a substrate and a board, the mechanical link being adapted to withstand strain.

It would further be advantageous to provide a strain relief mechanism so that a substrate under force that is undergoing movement relative to the surface of the printed circuit board on which it is mounted will continue to maintain an electrical and mechanical connection therewith.

It would also be advantageous to provide an electrical assembly comprising a plurality of electrical conductors which form a connection between a chip and the surface of a printed circuit board.

It would further be advantageous to provide a strain relief mechanism limited in height in order to accommodate electrical, mechanical and dimensional requirements.

SUMMARY OF THE INVENTION

In accordance with the present invention, there is provided an electrical assembly having an integrated circuit package which has a plurality of electrical conductors fixed thereto. The electrical conductors form mechanical and electrical connections. Each of the electrical conductors has a root at one end and a tip at the other end. The root of each conductor is attached to the integrated circuit package to form a fixed electrical and mechanical connection. The tip of each conductor is adapted to be connected to a surface at a predetermined location. Each of the electrical conductors has at least two bends between the root and the tip for providing strain relief when the tip is connected to a surface.

BRIEF DESCRIPTION OF THE DRAWINGS

A complete understanding of the present invention may be obtained by reference to the accompanying drawings, when taken in conjunction with the detailed description thereof and in which.

DETAILED DESCRIPTION OF THE PREFERRED EMBODIMENT

Figure 1:
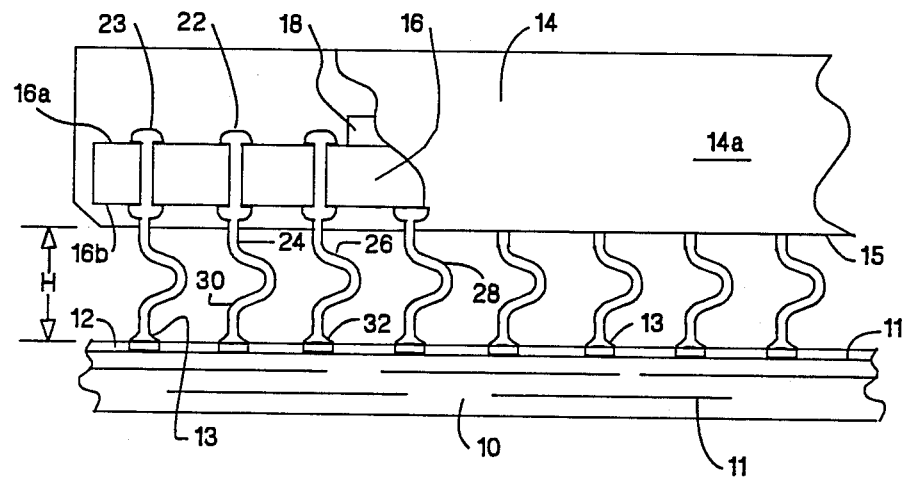
FIG. 1 is a enlarged cross-sectional cut away view of an electrical assembly in accordance with the present invention.

Referring now to FIG. 1, there is provided a generally planar board 10 fabricated from epoxy and glass or similar materials that are electrically non-conducting. Embedded in the board 10 are layers of copper 11 or similar electrically conductive material. The upper surface of the board 12 has a pattern of electrically conductive pads 13 forming electrical and mechanical connections to the board 10. Copper is most commonly used to form such pads 13 but other materials could be used.

Disposed above the board 10 is an integrated circuit package 14. The package 14 has a cap 14a with lower edge 15 which is substantially parallel to the upper surface 12 of the board 10. Within the package 14 is a substrate 16 fabricated from ceramics in the preferred embodiment. The substrate 16 is generally rectangular having a surface area in the range of 0.25 to 9 square inches. The lower edge 15 of the package cap 14a need not extend below the substrate 16 and need not even be present. Mounted on the substrate 16 by solder or other suitable means is an integrated circuit chip or similar electronic component or device 18. It should be understood that any appropriate device can be used in conjunction with this invention, not necessarily limited to electrical components. For example, optical devices for which strain relief is required can also take advantage of the present invention.

In the preferred embodiment, the substrate 16 has a plurality of holes 20 drilled or etched completely through the substrate 16. The most convenient and conventional shape of these holes 20 is circular, but other shapes can be formed, such as triangles, rectangles and polygons. These holes 20 are known as pin holes.

Extending completely through the pin holes 20 of the substrate 16 are relatively thin pins 22. In the preferred embodiment, pins 22 have a diameter in the range of 0.01 and 0.02 inches. The pins 22 are fabricated of an electrically conductive material such as copper. The cross section of any one of these pins 22 is generally circular, but other cross sectional shapes such as polygons or flat strips can be used to accommodate the shape of the pin holes 20.

The pins 22 begin with a head 23 at the upper surface 16a of the substrate 16 and extend through the pin holes 20 to the lower surface 16b of the substrate 16 and continue through the lower surface 15 of the integrated chip package 14. The distance from the lower surface 16b of the substrate 16 to the upper surface 12 of the board 10 is identified by the letter H. The dimension H is normally between 0.080 and 0.110 inches. A portion of each pin 22 extending beyond the integrated circuit package 14 is called a root and is identified by reference numeral 24. The pin 22 is bent or formed at reference numeral 26 and reformed back on itself (i.e., in the same plane) at reference numeral 28 to form a knee 29. The lowermost portion of each pin 22 is then bent once again, also in the same plane, at reference numeral 30 so that the lowermost extension of the pin 22, called the tip 32, is substantially perpendicular to the planes of the substrate 16 and board 10 and directly below the root 24, coaxial therewith. In this way, all bends of an individual pin 22 are in the same plane, which plane is substantially perpendicular to the plane of the board 10.

The tip 32 of the pin 22 is fixedly attached in the preferred embodiment to the board 10 by means of solder, bonding or the like. The knee 29 of each pin 22 is formed along a predetermined plane. The number and alignment of all such planes perpendicular to the plane of the board 10 can be arranged to suit the desired configuration. It can be seen that the knee 29 of any pin 22 can extend in proximity to, and mesh with, the opening formed by the knee 29 of an adjacent pin 22. In practice, however, it has been found that manufacturing techniques are simplified when such meshing is not required (i.e., when the distance between pins 22 is greater than the length of the knee 29).

Figure 2:
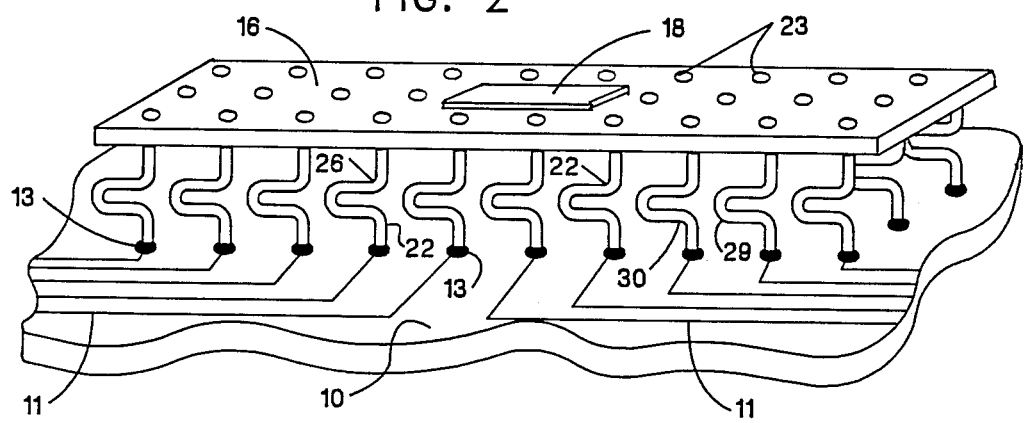
FIG. 2 is an enlarged perspective view of a printed circuit board on which is mounted a substrate by means of a strain relief device in accordance with the present invention.

Referring now also to FIG. 2, there is shown an integrated circuit chip 18 disposed on a rectangular ceramic substrate 16. Rectangular and square substrates are most common, but other geometric shapes can also be used without departing from the spirit and scope of the present invention. The substrate 16 has a plurality of pin holes 23, each of which has a pin 22 extending therethrough. The pin holes 23 are arranged in one or more rows along the periphery or within the boundaries of the substrate 16 in the preferred embodiment. Any suitable configuration of holes 23 can be used in accordance with the present invention, another of which configurations is shown and described hereinbelow in conjunction with FIG. 4.

The substrate 16 is mounted by means of the pins 22 to a printed circuit board 10 on or in which is disposed a plurality of circuit lines 11 comprising an electrically conductive material such as copper. Although not shown in FIG. 2 for simplification purposes, in practice the number of circuit lines 11 can approach that of the number of pins 22. At least some of the pins 22 are fixedly attached to the circuit lines 11 by means of a suitable bonding or similar attachment technique.

Figure 3A:
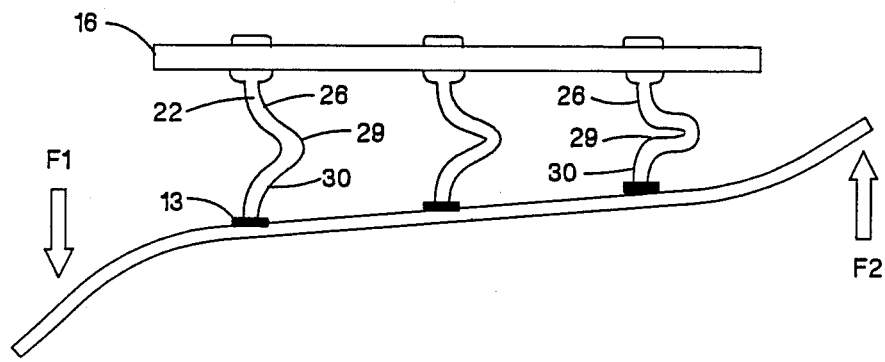
FIGS. 3a and 3b are schematic representations of the apparatus of the present invention shown undergoing a force applied to a printed circuit board.

Referring now also to FIG. 3a, there is shown a simplified cross-sectional schematic view of an exaggerated relative movement of a board 10 and substrate 16 with pins 22 therebetween. The view is simplified in that only three pins 22 are depicted representing a plurality of pins 22 in various intermediate states of deformation, depending upon their location. In operation, the leftmost pin 22 is elongated by action of a force $F_1$ upon the board 10. The deformation of the board 10 relative to the substrate 16 is accommodated by the temporary change in radius of the pin bends 26 and 30 and knee 29, preventing or minimizing the risk of rupture of the pin to board connection or pad 13. Similarly, the rightmost pin 22 is compressed by action of a force $F_2$ upon board 10. The shape of the pin bends 26 and 30 and knee 29 accommodates such a compressive force.

Figure 3B:
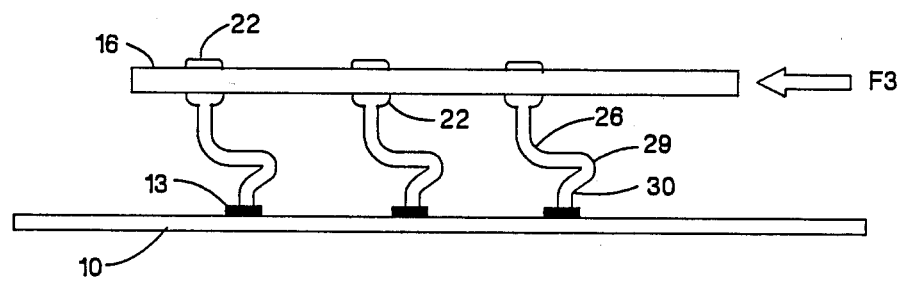

Referring now also to FIG. 3b, there is shown another simplified cross-sectional schematic view of an exaggerated relative movement of a board 10 and substrate 16 with pins 22 therebetween. The view is simplified in that only three pins 22 are depicted representing a plurality of pins 22 in various intermediate states of deformation, depending upon their location. In operation, the pins 22 are deformed by action of a force $F_3$ upon the board 10 and in a direction along the plane of the substrate 16. Although a force $F_3$ is shown in this figure from one direction only, the pins 22 are adapted to accommodate such a lateral force from any direction along the plane of the substrate 16. The movement of the board 10 relative to the substrate 16, is accommodated by the temporary change in the shape of the pin, preventing or minimizing the risk of rupture of the pin to board connection or pad 13. The overall length of the pin including bends 26 and 30 and knee 29 accommodates such a lateral movement.

It should also be understood that any combination of forces $F_1$, $F_2$ (FIG. 3a) and $F_3$ (FIG. 3b) resulting in an X-, Y-, Z-direction or skewing relative displacement can be accommodated by the present invention.

Figure 4:
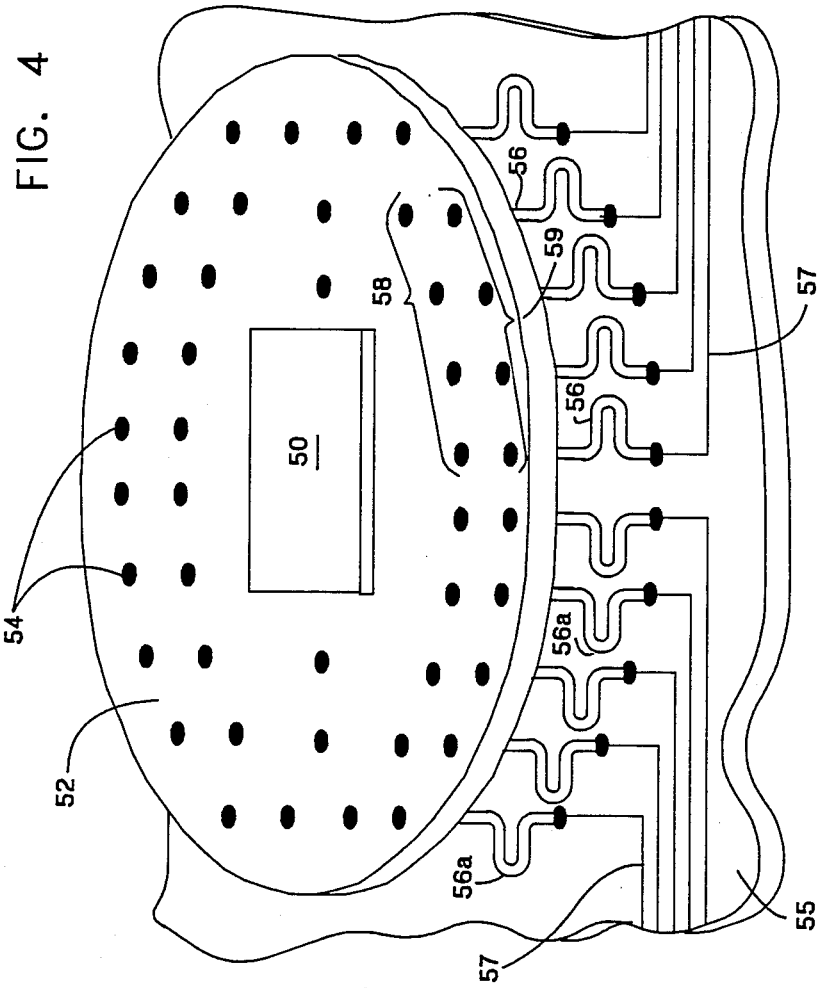
FIG. 4 is a top perspective view of a pattern of electrical conductors in accordance with an alternate embodiment of present invention.

Referring now also to FIG. 4, there is shown a top perspective view of an integrated circuit package in accordance with an alternative embodiment of the present invention. A chip 50 is disposed on a ceramic substrate 52. The substrate 52 is planar and circular. Any other geometric shape can also be used. Pin holes 54 are provided in a plurality of rows within the periphery of the substrate 52. Extending through each of the pin holes 54 is a pin 56. The substrate 52 is disposed on a printed circuit board 55 on which are disposed circuit lines 57.

In the radial configuration, the knees 56a of the pins 56 of each row or track 58 and 59 can be aligned with the knees 56a of the pins 56 in subsequent rows. Accordingly, the knees 56a of the pins 56 that lie in the inner track 58 can be adapted to fit into the respective openings formed by the knees 56a of the pins 56 that lie in the outer track 59. In this manner, it can be seen that the knees of pins in any given interior track can be caused to mesh with the openings formed by the knees of an adjacent exterior track. The actual meshing or overlapping of pins 56 need not be required, however, if manufacturing difficulties preclude it. Any reasonable geometric configuration can be used to advantage with kneed pins of the present invention.

Figure 5:
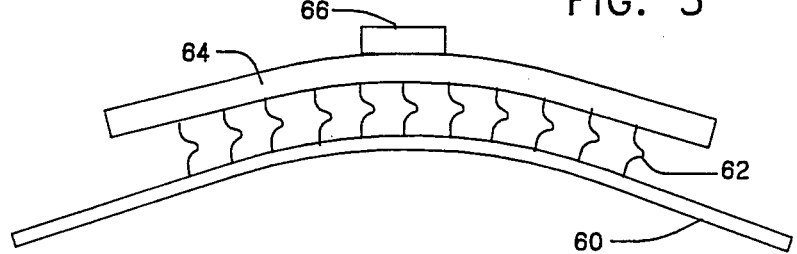
FIG. 5 is an embodiment of the present invention shown in conjunction with a non-planar surface.

Referring now also to FIG. 5, there is shown another embodiment of the present invention. A curved board 60 forms the base for a plurality of pins 62 which, in turn, are attached to a curved substrate 64. An integrated circuit chip 66 is fixedly attached to the substrate 64 by means of solder, bonding or other conventional fixed attachment means well known in the art. This packaging structure represents a board 60 and substrate 64 shown in their original shapes. The curvature of the substrate 64 conforms to that of the board 60 in such a manner that their respective curved planes are substantially parallel to one another. It should be noted that the curvature of the substrate 64 need not correspond to that of the board 60, however, and in operation, due to tensile forces and stress, often does not precisely correspond at all points. It is in those dynamic and sometimes unstable situations that the present invention provides great advantages.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. An electrical assembly comprising:
   (a) a printed circuit board having at least one major surface having predetermined locations thereon which are adapted to receive electrical conductors;
   (b) a substantially planar integrated circuit package having a plurality of electrical conductors fixed thereto and extending therefrom so as to form mechanical and electrical connections between said printed circuit board and said integrated circuit package, said integrated circuit package having a central area and a periphery surrounding said central area, some of said plurality of electrical conductors being fixed to said central area; and
   (c) each of said electrical conductors located within said integrated circuit package and extending therefrom and having a root at one end, a curved knee portion, and a tip at the other end thereof, each of said conductors being attached at said root to said integrated circuit package and at said tip to said printed circuit board to form said fixed electrical and mechanical connection, said root and said tip of each of said electrical conductors lying along the same axis perpendicular to the plane formed by said integrated circuit package, each of said electrical connectors providing strain relief between said printed circuit board and said integrated circuit package components of said electrical assembly to accommodate for forces applied to said components in at least three directions while maintaining said mechanical and electrical connections.

2. The electrical assembly in accordance with claim 1 wherein the locations of said roots of said plurality of electrical conductors form a cartesian matrix on said integrated circuit package.

3. The electrical assembly in accordance with claim 2 wherein the planes of said electrical conductor knees are non-orthogonal with respect to said matrix of electrical conductor roots.

4. The electrical assembly in accordance with claim 2 wherein said knee of predetermined electrical conductors is adapted to mesh with a knee of other predetermined electrical conductors.

5. The electrical assembly in accordance with claim 1 wherein said integrated circuit package and said printed circuit board are both substantially planar and the plane of said integrated circuit package is substantially parallel to the plane of said printed circuit board.

6. The electrical assembly in accordance with claim 1 wherein the cross-section of each of said electrical conductors is non-rectilinear.

7. The electrical assembly in accordance with claim 6 wherein the cross-section of each of said electrical conductors is a polygon having five or more sides.

8. The electrical assembly in accordance with claim 6 wherein the cross-section of each of said electrical conductors is substantially circular.

9. The electrical assembly in accordance with claim 1 wherein said tip of each electrical conductor is fixedly connected by solder to one of said predetermined locations on the surface of said printed circuit board.

10. The electrical assembly in accordance with claim 1 wherein said tip of each electrical conductor is fixedly connected by bonding to one of said predetermined locations on the surface of said printed circuit board.

11. The electrical assembly in accordance with claim 1 wherein the locations of said roots of said plurality of electrical conductors form a polar matrix on said integrated circuit package.

12. The electrical assembly in accordance with claim 11 wherein the planes of said electrical conductor knees are substantially radial.

13. The electrical assembly in accordancae with claim 12 wherein said knee of predetermined electrical conductors is adapted to mesh with a knee of other predetermined electrical conductors.

14. The electrical assembly in accordance with claim 10 wherein the locations of said roots of said plurality of electrical conductors form a cartesian matrix on said integrated circuit package.

15. The electrical assembly in accordance with claim 14 wherein the axes of said electrical conductor knees are non-orthogbnal with respect to said matrix of electrical conductor roots.

16. The electrical assembly in accordance with claim 14 wherein said knee of predetermined electrical conductors is adapted to mesh with a knee of other predetermined electrical conductors.

17. An electrical assembly comprising:
   (a) an integral circuit package having a plurality of electrical conductors fixed thereto and extending therefrom so as to form mechanical and electrical connections between said package and an external surface when said conductors are attached thereto, said integrated circuit package having a central area and a periphery surrounding said central area, some of said plurality of electrical conductors being fixed to said control area; and
   (b) each of said electrical conductors located within said integrated circuit package and having a root at one end attached to said package and a tip at the other end thereof adapted to be fixedly connected to said external surface at a predetermined location thereon, each of said electrical conductors having a curved knee portion including at least two bends said root and said tip for providing strain relief between said integrated circuit package and said external surface when said tip is connected to said surface to accommodate for forces applied to said package and surface in at least three directions while maintaining said mechanical and electrical connections.

18. The electrical assembly in accordance with claim 17 wherein said root and said top of each of said electrical conductors lie along the same plane perpendicular to the plane formed by said integrated circuit package.

19. The electrical assembly in accordance with claim 17 wherein the cross-section of each of said electrical conductors is non-rectilinear.

20. The electrical assembly in accordance with claim 19 wherein the cross-section of each of said electrical conductors is a polygon having five or more sides.

21. The electrical assembly in accordance with claim 19 wherein the cross-section of each of said electrical conductors is substantially circular.

22. The electrical assembly in accordance with claim 21 wherein the locations of said roots of said plurality of electrical conductors form a polar matrix on said integrated circuit package.

23. The electrical assembly in accordance with claim 22 wherein the planes of said electrical conductor knees are substantially radial.

24. The electrical assembly in accordance with claim 23 wherein said knee of predetermined electrical conductors is adapted to mesh with a knee of other predetermined electrical conductors.

* * * * *

UNITED STATES PATENT AND TRADEMARK OFFICE
CERTIFICATE OF CORRECTION

PATENT NO. : 4,764,848
DATED : August 16, 1988
INVENTOR(S) : J. P. Simpson

It is certified that error appears in the above—identified patent and that said Letters Patent is hereby corrected as shown below:

In the Claims, Column 8, Line 29, "non-orthogbnal" should be --non-orthogonal--.
Column 8, Line 36, "integral" should be --integrated--.
Column 8, Line 52, insert "between" before "said" (first use).
Column 8, Line 60, "top" should be --tip--.

Signed and Sealed this

Second Day of May, 1989

*Attest:*

DONALD J. QUIGG

*Attesting Officer*    *Commissioner of Patents and Trademarks*